United States Patent [19]

Lambe et al.

[11] 4,163,920

[45] Aug. 7, 1979

[54] SOLID STATE SOURCE OF RADIANT ENERGY HAVING A CONTROLLABLE FREQUENCY SPECTRA CHARACTERISTIC

[75] Inventors: John J. Lambe, Birmingham; Shaun L. McCarthy, Ann Arbor, both of Mich.

[73] Assignee: Ford Motor Company, Dearborn, Mich.

[21] Appl. No.: 836,624

[22] Filed: Sep. 26, 1977

[51] Int. Cl.² ...................... H05B 33/02; H01L 33/00
[52] U.S. Cl. .................................... 313/503; 313/116
[58] Field of Search ............... 313/499, 500, 503, 116, 313/483, 498

[56] References Cited

U.S. PATENT DOCUMENTS

| 3,116,427 | 12/1963 | Giaever | 313/346 R |
| 3,947,840 | 3/1976 | Craford et al. | 313/500 X |

OTHER PUBLICATIONS

"Plasma Radiation from Tunnel Junctions," by T. L. Hwang et al., *Physical Review Letters*, vol. 36, No. 7, Feb. 16, 1976, pp. 379-382.

*Primary Examiner*—Palmer C. Demeo
*Attorney, Agent, or Firm*—Paul K. Godwin, Jr.; Clifford L. Sadler

[57] ABSTRACT

A solid state source of radiant energy having a characteristic frequency spectra with a high frequency cutoff $\nu_{co}$, which is a function of the applied voltage value. The source is a metal-insulator-metal tunnel junction wherein the insulator layer is relatively thin with respect to the metal layers and inelastic tunneling occurs. To facilitate output coupling to surface plasmon modes in the junction, the counter-electrode metal layer, from which the radiant energy is emitted, is roughened.

7 Claims, 2 Drawing Figures

SOLID STATE SOURCE OF RADIANT ENERGY HAVING A CONTROLLABLE FREQUENCY SPECTRA CHARACTERISTIC

BACKGROUND OF THE INVENTION

1. Field of the Invention

The present invention relates to a solid state device which responds to values of applied voltage by emitting radiant energy having a known frequency spectra with a predictable high frequency cutoff value $\nu_{co}$ for each value of applied voltage.

2. Description of the Prior Art

Numerous electroluminescent solid state devices have been developed, which emit relatively narrow bands of light in response to applied voltages. Such devices are commonly referred to as light emitting diodes (LED) and are commonly constructed as PN junctions wherein the injection of minority carriers into a conductivity type region provides the basis for carrier recombination and gives rise to a narrow band of radiation.

Visual observation of light emitted from metal-oxide-metal (M-O-M) sandwiches was described in early work by J. F. DeLord et al, in an article entitled "Correlation Between Electroluminescence and Electron Emission of Thin Metal-Oxide-Metal Sandwiches," which appeared in Applied Physics Letters, Volume 11, No. 9 Nov. 1, 1967, pages 287–289. In this article, thin sandwich structures of Be—BeO—Au and Al—Al$_2$O$_3$—Ag, having oxide thicknesses of from 100 to 150 Å, were described as being constructed to investigate the nature of electron emission. A first type of luminescence was reported as being a bright irreversible disruptive flash or sparking which permanently altered the characteristics of the device. A second type of luminescence was noted as a very faint bluish glow observed at a low current level on cooled devices. The DeLord et al article concludes that electron emission from the metal-oxide-metal sandwich structures was entirely due to the photoelectric effect caused by electroluminescence produced within the oxide layer.

Later work was described by H. Kanter in an article entitled "Comments on Correlation Between Electroluminescence and Electron Emission of Thin Metal-Oxide-Metal Sandwiches," which appeared in Applied Physics Letters, Volume 12, No. 8, Apr. 15, 1968, pages 243–244. That article indicated Al—Al$_2$O$_3$—Au structures, having oxide layers of 100 Å, produce electron current dominated by photoelectron emission released in the top layer through electroluminescence radiation within the oxide at large field strenghts created by high voltages in excess of 8 volts.

SUMMARY OF THE INVENTION

As noted in our article entitled "Light Emission From Inelastic Electron Tunneling," published in the Physical Review Letters, Volume 37, Oct. 4, 1976, pages 923–925, and incorporated herein by reference, the present invention yields a broad-band light source with a high frequency linear cutoff value that is dependent upon the applied voltage through the quantum relation $h\nu_{co} = |eV|$. The light source is constructed as a metal-insulator-metal tunneling junction, which, when activated by an applied voltage, emits a broad-band of radiation uniformly over the junction area regardless of the polarity of the applied voltage. Light emission from the counter-electrode of the junction is due to inelastic tunneling through a relatively thin oxide insulator, and optical output coupling of surface plasmon modes in the junction is achieved by roughing or etching the counter-electrode to render it slightly porous.

Accordingly, it is an object of the present invention to provide a unique solid state source of broadband radiation having an upper cutoff frequency value which is a function of the value of voltage applied to that source.

It is another object of the present invention to provide a solid state light source that provides a broadband spectra of radiation determined by the value of voltage applied thereto.

It is a further object of the present invention to provide a metal-insulator-metal tunneling junction whereby light is emitted therefrom via inelastic tunneling which is nondestructive to the junction.

It is still a further object of the present invention to provide a novel light source in which the upper cutoff frequency can be controlled by corresponding control of the applied voltage valve.

It is a further object of the present invention to provide a method of constructing a novel light source comprising a metal-insulator-metal junction whereby the counter-electrode is roughened to provide optical output coupling of surface plasmon modes in the junction.

DETAILED DESCRIPTION OF THE INVENTION

The present invention is a novel light source in the form of a metal-insulator-metal tunnel junction. In this junction, an external electrode, termed a "counter-electrode" is roughened so as to effect optical output coupling to surface plasmon modes which are present in the junction when inelastic tunneling occurs. Inelastic tunneling occurs in this unique junction because of the relatively thin insulator layer, which is heat treated to decrease the tunneling conductance.

Figure 1:
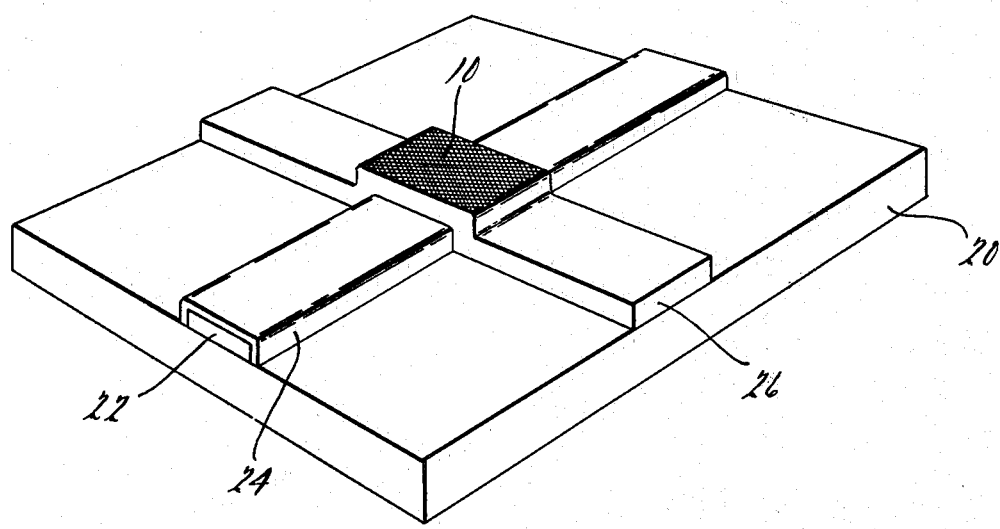
FIG. 1 illustrates the metal-insulator-metal structure of the present invention.

As shown in FIG. 1, a substrate 20 is a support structure for the junction having a first metal electrode 22 deposited thereon. A relatively thin insulating layer 24 covers the first electrode 22 and a counter-electrode 26 is cross-oriented to define the junction area 10. In operation, voltage is applied between the first electrode and the counter-electrode.

Fabrication of the unique solid state source of radiant energy, schematically illustrated in FIG. 1, is performed in a manner similar to the fabrication of the tunnel junction described in commonly assigned U.S. Pat. No. 3,469,184.

In the preferred embodiment, aluminum was selected as a first metal electrode 22 to be evaporated onto the support substrate 20 because of its high optical reflectivity and low electrical resistance. Samples of the junction were fabricated having aluminum film thicknesses ranging from approximately 200 to 1000 Å and found to have favorable performance characteristics. Following the formation of the first electrode film 22, an insulating layer 24 was formed thereon. Since aluminum was selected as the first electrode 22 of the preferred embodiment, the aluminum film was oxidized in order to form an optically non-absorbing insulating layer 24 of $Al_2O_3$. An insulating layer having a thickness of approximately 30 Å was found to be adequate to withstand voltages of up to 4 volts and to conduct sufficient tunneling current so that light can be observed.

Following the formation of the insulating layer 24, a counter-electrode 26 having a thickness in the range of approximately 100–300 Å was evaporated over a portion of the insulating layer, while the substrate was cooled to approximately 77° K. It was found that counter-electrodes of Ag, Au, Pb or In were operational, while Ag was preferred because of its low optical absorption characteristics. Following the formation of the counter-electrode 26, wherein the common area of insulating layer and first electrode overlayed by the counter-electrode forms the tunnel junction 10, a mild etch solution was used to roughen the counter-electrode 26 and render it slightly porous. This was done to provide optical output coupling to the surface plasmon modes in the junction.

Etching of the Ag counter-electrode material, in the above example, was performed by exposing the counter-electrode to Br. A 0.01% solution of Br in carbon tetrachloride at room temperature was supplied, and the junction was dipped therein for approximately 15 seconds. The junction was then removed to the atmosphere and heated to approximately 150° C. for approximately 1 minute. The heating of the junction causes a decrease in the tunneling conductance and thus limits the current at a peak bias voltage of approximately 4 volts. The sample junctions described above have an area of approximately $5 \times 10^{-2} cm^2$ and have a zero bias conductance of approximately $10^{-2} mho/cm^2$.

When voltage is applied to the electrodes 22 and 26, visible light emanates from the entire junction area 10 and the emission is observed to change from deep red, at low voltage, to orange to blue-white as the voltage is increased.

We believe that the light emission is due to inelastic tunneling in the junction (LEIT) and is due to tunneling electrons which excite an optically coupled surface plasmon mode in the junction with a frequency $v$, provided that $|eV| \geq hv$. Such a notion presumes that a threshold is established for inelastic tunneling vibrational spectra.

At very low temperatures, the form of the inelastic excitation will be $L(v) = P(v,V)$ $(|V| - hv/e) \cdot \theta |V| - hv/e)$, where $L(v)$ is the number of photons emitted with frequency within the interval $dv$. $P(v,V)$ is a slowly varying function of frequency and voltage involving the density of surface modes and the inelastic excitation and radiation probabilities. $\theta(|V| - hv/e)$ is the step function that reflects the cutoff of photon emission at the quantum condition. Thus, a linear cutoff is predicted in the spectra as $hv$ approaches $|eV|$.

Figure 2:
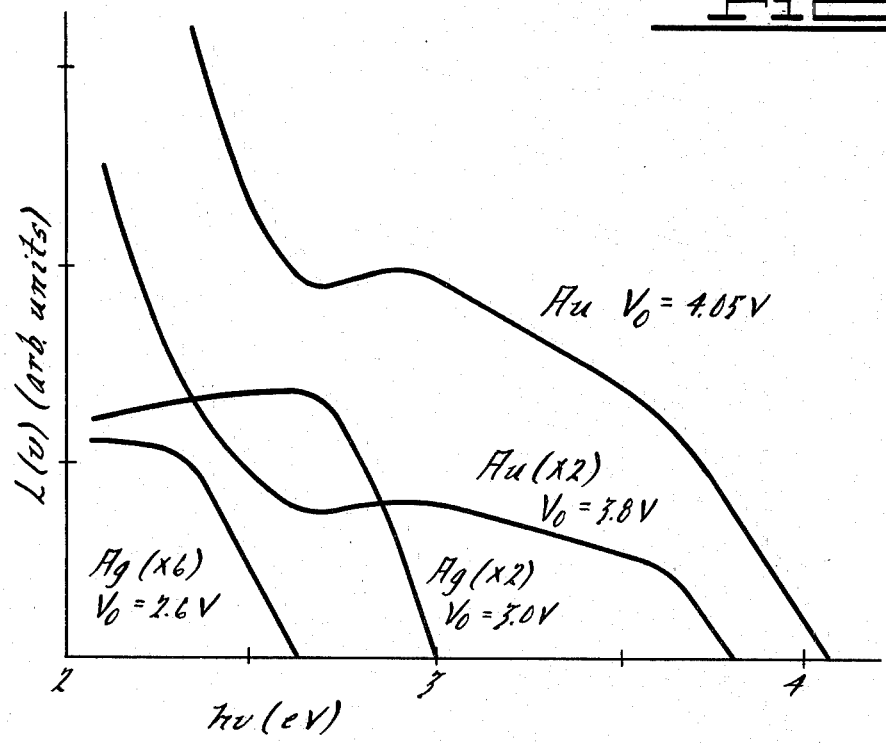
FIG. 2 is a plot of L($\nu$), the photon flux per unit frequency bandwidth versus h$\nu$ for an Au counter-electrode junction and an Ag counter-electrode junction at different junction bias voltages, wherein the junction temperature is approximately 77° K.

In FIG. 2, a plot of $L(v)$, the photon flux per unit frequency bandwidth, versus $hv$ for both Au and Ag counter-electrode junctions is indicated for different junction bias voltages when the junctions are maintained at 77° K. Although the light emission effect can be observed at room temperature, higher stability was found to be maintained at 77° K.

As can be seen from FIG. 2, when the bias voltage across the tunnel junction, utilizing an Au counter-electrode, has a value of 3.8 volts, the frequency spectra shows a shart cutoff frequency at approximately 3.8 electron volts. When the biasing voltage is changed to 4.05 volts, the frequency spectra of the tunnel junction employing the Au counter-electrode shows a high frequency cutoff value of approximately 4.05 electron volts. Although the measurement of $L(v)$ of photon flux per unit frequency bandwith is shown in arbitrary units along the "Y" axis of the plot in FIG. 2, it can be seen that as the biasing voltage is lowered, the value of $L(v)$ increases by the indicated orders of magnitude (see the parentheses following the counter-electrode element legend).

Improved results are indicated in FIG. 2 when an Ag counter-electrode is employed. In that case, when a biasing voltage of 3.0 volts is applied across the junction, the high frequency cutoff value of the radiated spectra is seen at 3 electron volts. Similarly, when a biasing voltage of 2.6 volts is applied across the tunnel junction having an Ag counter-electrode, the high frequency cutoff value is approximately 2.6 electron volts.

For each of the metals selected for use as counter-electrodes, it was observed that the high frequency cutoff value is a linear function of the value of applied voltage, and as the voltage is increased from zero, more and more of the visible spectrum is radiated. It was further found that the broadband emission is not significantly effected by the polarity of the biasing voltage since the relation $hv_{co} = |eV|$ is unaffected by sign reversal. However, when the direction of the tunneling current is reversed, there is some change in intensity.

It will be apparent to those skilled in the art that many modifications as to the particular materials and elemental configurations may be made without departing from the scope of this basic invention. Therefore, the foregoing embodiments of the present invention should be interpreted as being examples of the preferred mode known at this time and not restrictive of the scope of the appended claims.

We claim:

1. A solid state source of radiant energy comprising a metal-insulator-metal tunnel junction wherein one of said metals defines an electrode and the other of the metals defines a counter-electrode containing a means for output coupling surface plasmon modes in response to applied voltage, and said junction thereby emits a visible light spectra having a high frequency cutoff value which is proportional to the value of the applied voltage.

2. A solid state source of radiant energy comprising a metal-insulator-metal tunnel junction, wherein a first underlying metal electrode layer of said junction is highly reflective and optically non-absorbent, the insulator layer is optically non-absorbent and an overlying metal counter-electrode layer is porous; and further wherein said source is characteristically responsive to voltage applied to said first electrode and said counter-electrode by emitting radiation having a visible light spectra from said counter-electrode, and further wherein said spectra has a high frequency cutoff value which is proportional to the value of the applied voltage.

3. A solid state source as in claim 2, wherein said high frequency cutoff value is a linear function of $(|eV|/h)$, wherein h is the Planck constant, e is the electron charge and v is the value of the applied voltage.

4. A solid state source of visible radiant energy comprising:
   a first electrode element;

an insulating layer overlying said first electrode element; and a counter-electrode overlying said insulating layer to form a tunnel junction which generates surface plasmon modes in response to voltage applied between said first electrode and said counter-electrode, wherein said counter-electrode includes means for providing optical output coupling of said surface plasmon modes in a visible light spectra having a high frequency cutoff $v_{co}=(|eV|/h)$, wherein h is the Planck constant, e is the electron charge and V is the value of the applied voltage.

5. A solid state source as in claim 4, wherein said optical output coupling means is defined as a roughened surface on said counter-electrode.

6. A source as in claim 5, wherein the first electrode is formed of a film of aluminum, said insulating layer is formed of aluminum oxide to a thickness of approximately 30 Å and said counter-electrode is formed as a porous film selected from the group consisting of silver, gold, lead and indium.

7. A source as in claim 6, wherein said first electrode has a thickness measurement in a range of from 200–1000 Å, and said counter-electrode has a thickness measurement in a range of from 100–300 Å.

* * * * *